United States Patent [19]
Schwob

[11] Patent Number: 5,140,187
[45] Date of Patent: Aug. 18, 1992

[54] REGENERATIVE COMPARATORS

[75] Inventor: Walter Schwob, Vaud, Switzerland

[73] Assignee: Motorola, Inc., Schaumburg, Ill.

[21] Appl. No.: 560,621

[22] Filed: Jul. 30, 1990

[30] Foreign Application Priority Data

Aug. 26, 1989 [GB] United Kingdom ............... 8919475

[51] Int. Cl.⁵ .................... H03K 5/24; H03K 5/12
[52] U.S. Cl. ........................... 307/355; 307/263; 307/359; 307/494
[58] Field of Search ............. 307/350, 359, 360, 362, 307/355, 491, 494, 530, 263

[56] References Cited

U.S. PATENT DOCUMENTS

| | | | |
|---|---|---|---|
| 4,406,955 | 9/1983 | Lo Cascio | 307/362 |
| 4,439,694 | 3/1984 | Fox | 307/362 |
| 4,642,484 | 2/1987 | Skovmand et al. | 307/362 |
| 4,654,545 | 3/1987 | Giordano | 307/362 |
| 4,814,642 | 3/1989 | Kleks | 307/362 |

FOREIGN PATENT DOCUMENTS 0188226 10/1984 Japan ................... 307/360
0010917 1/1987 Japan ................... 307/359

Primary Examiner—John Zazworsky
Attorney, Agent, or Firm—Robert D. Atkins

[57] ABSTRACT

A comparator includes a differential stage based upon transistors Q3 and Q4, the differential stage being adapted to receive via a pad an input $V_{in}$, being a signal to be compared with a reference input $V_{ref}$ received via a second pad. The pads constitute respectively the inverting and reference inputs of the comparator. The comparator also includes an output stage being of the form of a flip-flop providing an output Q and a complementary output $Q^-$. The circuit further includes a first current generator supplying the differential stage and a second current generator connected to a diode and a transistor intermediate the differential stage and the output stage. Current steering of the current generated by second current generator by the transistor and diode path controls the output stage as the state of the differential stage changes. The transistor forms an intermediate stage which is also part of the differential stage regenerative loop.

8 Claims, 1 Drawing Sheet

REGENERATIVE COMPARATORS

FIELD OF THE INVENTION

This invention relates to comparators, and in particular to comparators to be formed as an integrated circuit, either as a device in its own right or as a cell of circuit of larger functionality of which the comparator forms a part.

BACKGROUND OF THE INVENTION

A comparator in use typically is arranged to compare a varying input voltage with a fixed reference voltage and to provide an output signal transition or trigger whenever an excursion of the input crosses the reference. In critical applications where inaccurate or slow trigger would adversely affect co-operating circuits, a high gain operational amplifier may be used in a feed back configuration to provide a fast and repeatable trigger. Unfortunately in order to provide noise immunity by hysteresis, high value resistors are required in the feed back path and consequently such an arrangement cannot be successfully integrated.

A comparator is essentially a differential device producing an output signal dependent upon the difference between two inputs. As such a differential stage is required at the input and a single-ended stage is required to provide the output. An example of a differential stage which may be successfully integrated is the classical long tail transistor pair in which two transistors with common emitters are supplied with a constant current, each transistor receiving one of the signals for comparison at its base. The configuration is symmetrical and varies between a first stable state (input below reference, for example) wherein the transistor on the input side sustains the entire current flow and a second stable state (input above reference), wherein the transistor on the reference side sustains the current. Between the two stable states (input approaching reference) the arrangement enters an active region while the transition from one state to the other occurs. In this region the current is shared by the transistor pair dependent upon the precise relationship between the input and the reference.

An output (either inverted or not depending upon the selection) maybe provided by a direct connection to the collector of a transistor of the pair. Effectively being high level or low level depending upon whether the transistor is conducting or not. During transition however such an output is input dependent and variations in the input will appear at the output. Such input tracking prevents a clean transition and is undesirable. Improvements can be made if the transition time can be shortened or if the output is provided by a further stage (a transistor arranged as a switch for example) optimized to toggle between fixed output values, with a reduced active region of its own. If complementary inverting and non-inverting outputs are required a further output device toggling in the opposite sense may be used.

To shorten the transition time a regenerative arrangement may be used in which feedback is applied to one of the transistor bases acting in the same sense as the transition, thus the transition is regenerative and no longer relies on the input to attain the stable state. However, the feedback cannot be applied until the transition has begun to a substantial extent and even with such arrangements the configuration passes through a stage of non-regenerative transition.

Arrangements employing both regenerative differential techniques and optimised output stages have been successfully integrated, however their performance remains inferior to that of the feedback operational amplifier and may be unacceptable in some critical applications.

Consider, for example, a microprocessor controlling critical plant. If the power supply to the processor were to fail momentarily and then be restored, the processor may enter some random state and the control be invalid with potentially disastrous results. A solution is to monitor the supply voltage and if it falls below a certain level to provide a reset signal to the processor. A comparator may be used for this purpose of monitoring the supply level, and it is desirable that an integrated comparator be used so that all supply management functions required by the processor may be integrated within a single device.

Unfortunately comparators which have been integrated to date have proved inadequate for this purpose due to problems of glitching (spurious pulses without full trigger) and, in complementary output types, output overlap, particularly in applications where the input is subject to slow variation.

SUMMARY OF THE INVENTION

According to the present invention a comparator for providing an output representative of the relative condition of two inputs includes a regenerative differential input stage for receiving the inputs,
an output stage to provide the output,
an intermediate stage for controlling the output stage to change the output in the event of detection of a change in the relative condition of the two inputs by the differential stage,
and means for inhibiting said output change until onset of differential stage regeneration.

Advantageously, the intermediate stage forms part of a regenerative loop, preferably providing gain for the regenerative loop. The regenerative loop may be said differential stage regenerative loop.

Preferably, the said intermediate stage takes a first state before regeneration and a second state following onset of regeneration, said second state controlling the output stage. A state of said first and second states may be a transistor off state and a state of said first and second states may be a transistor saturated state. Advantageously, differential stage regeneration is provided by feedback from the intermediate stage acting to influence an input of the differential stage.

In a preferred form of the present invention, the differential stage is provided by a differential transistor pair having a first state in which one transistor of the pair is conducting and a second state in which the other transistor of the pair is conducting and an active state to change from one state to another in the event of a change in the relative condition of two inputs applied to the differential pair and said intermediate stage is provided by a transistor linked to a conduction path of one of said transistors, the linkage being arranged to prevent full conduction of the transistor until regeneration of the differential stage; said full conduction controlling said output stage.

To further advantage, the differential stage may be provided by a differential transistor pair having a first state in which one transistor of the pair is conducting and a second state in which the other transistor of the pair is conducting and an active state to change from one state to another in the event of a change in the relative condition of two inputs applied to the differential pair and said intermediate stage may be provided by a transistor linked to a conduction path of one of said transistors, the linkage being arranged to maintain conduction of the transistor until regeneration of the differential stage, said conduction of said transistor controlling said output stage.

Preferably, hysteresis is provided by an offset applied to the reference voltage in one state of the differential stage.

Advantageously, the stage comprises a gate, and preferably complementary gates. For further preference, said gates are controlled by current steering of the output of a current generator by the intermediate stage, and for yet further preference, the output current of said current generator determines a component of bias applied to the differential stage in one state thereof to thereby determine hysteresis. A current in a path established to a first gate may be diverted to a second gate to control the output stage. To advantage, the intermediate stage provides gains so that the current steering is regenerative. To further advantage, the intermediate stage includes a transistor arranged to divert current from an established path driving a first gate to drive a second gate.

BRIEF DECRIPTION OF THE DRAWINGS

In order that features and advantages of the present invention may be further appreciated, embodiments will now be described with reference to the accompanying diagrammatic drawings, of which:

DETAILED DESCRIPTION OF THE INVENTION

Figure 1:
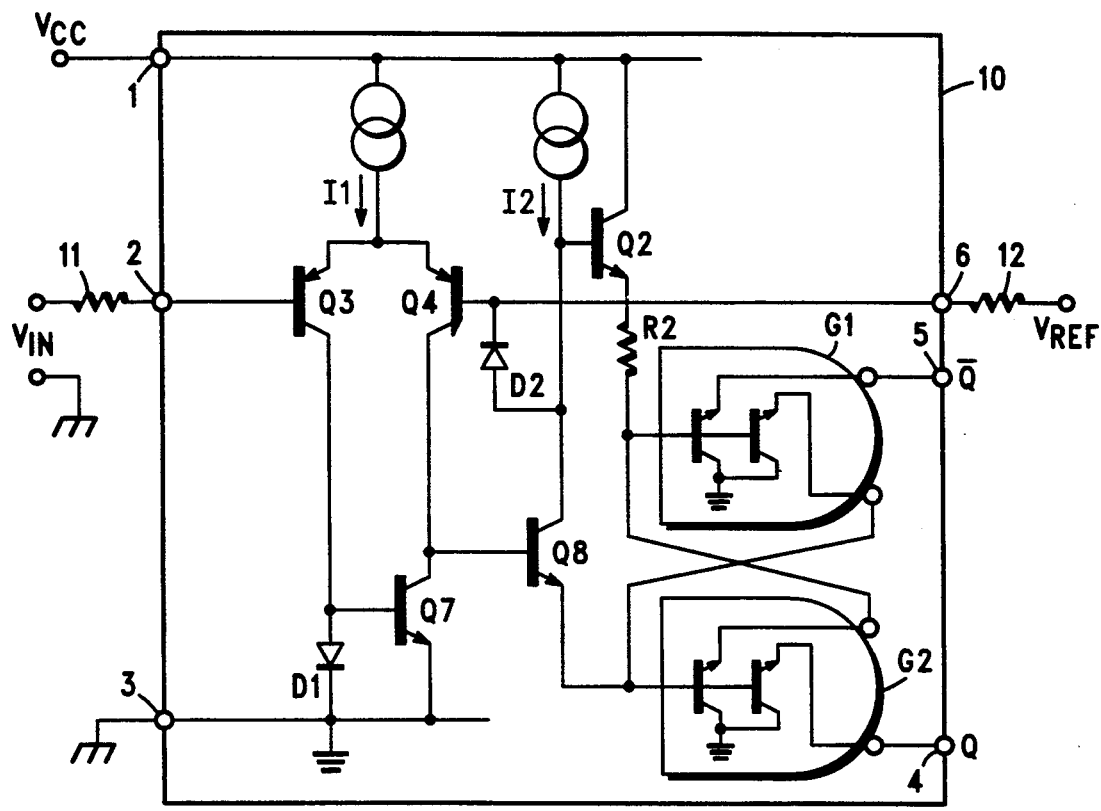
FIG. 1 represents a comparator in accordance with the present invention.

A comparator 10 (FIG. 1) provided as an integrated circuit cell has pads 1 and 3 for connection to a positive supply ($V_{cc}$) and ground respectively to provide a supply to the circuit. The comparator includes a differential stage based upon transistors Q3 and Q4, the differential stage is adapted to receive via a pad 2 an input $V_{in}$, being a signal to be compared with a reference input $V_{ref}$ received via a pad 6. Pads 2 and 6 constitute respectively the inverting and reference inputs of the comparator. Inputs $V_i$ and $V_{ref}$ are received via external resistors 11 and 12 respectively. The comparator also includes an output stage being of the form of a flip-flop providing an output Q at a pad 4 and a complementary output $Q^-$ at pad 5. The outputs Q and $Q^-$ constitute respectively the output and the inverted output of the comparator. Cross coupled gates G1 and G2 may constitute the flip-flop, the gates being implemented as Integrated Injection Logic (I²L) gates with the injector transistor omitted. The circuit further includes a first current generator I1 supplying the differential stage and a second current generator I2 connected to a diode D2 and a transistor Q8 intermediate the differential stage and the output stage.

In use, a supply is connected to pads 1 and 3 and a reference voltage connected to pad 6 via external resistor 12. The comparator then functions to provide a high signal at output Q when $V_{in}$ is less than $V_{ref}$ and a low output at Q when $V_{in}$ is greater than $V_{ref}$ output. $Q^-$ is the inverse of output Q. The detailed operation of the circuit of FIG. 1 is as follows.

Consider a voltage applied to the input $V_{in}$ coupled via resistor 11 to the input 2 of the comparator 10. If this voltage is at or near zero with respect to ground, then Q3 will be on and Q4, biased to $V_{ref}$ via resistor 12 and input 6 will be off. Q3 and Q4 behave in accordance with the well known characteristics of a long tailed pair differential stage. Thus, the current generated by current generator I1 flows via Q3 and D1 to ground. The forward voltage across D1 biases Q7 on but it will saturate since no current can pass via Q4. The saturation voltage of Q7 holds Q8 off, thus the current generated by current generator I2 flows via D2 and resistor 12 into $V_{ref}$. The current generator I2 pulls the base of Q2 high which stabilizes at a voltage applied to the input 6 of the comparator 10 plus the forward bias voltage of diode D2, with Q2 delivering current to the base of gate G1 turning it on and forcing its output low. The output $\bar{Q}$ of gate G1 which appears at output 5 of comparator 10 is therefore low. No current is supplied to the base of the G2 either by Q8 which is off, or the output of gate G1 which is low, hence G2 is off. The output of gate G2 which constitutes output Q appearing at terminal 4 is thus high since G2 is off. The cross coupling to the base of gate G1 has no effect and the flip-flop formed between gates G1 and G2 is stable in the set condition.

Consider now a positive ramp voltage applied to the input $V_{in}$. The state of the differential stages described above is stable until the voltage applied to the base of Q3 approaches that applied to the base of Q4. Once this condition is true, the differential stage enters its active region. When Q3 begins to turn off and Q4 begins to turn on, current flow via Q4 is accepted by transistor Q7, which begins to move out of saturation. It is important to note however that Q8 does not yet start to turn on.

When the stage is reached where the base voltage applied to transistor Q3 is exactly equal to the base voltage applied to transistor Q4, the current generated by the current generator I1 is divided equally down the two paths. The current mirror provided by the combination of diode D1 and transistor Q7 delivers a current at the collector of transistor Q7 exactly equal to that flowing through D1. Hence the current at the summing point of the differential stage (that is at the collector of transistor Q7) cancels and no current can flow into Q8. This is important since ensures that Q8 is off even at the point of balance of the differential stage and that the flip-flop formed by gates G1 and G2 therefore cannot reset. This is because of the condition:

$$I_{R2} * h_{FEG1} > I_{E8}$$

where $I_{R2}$ is the current through R2, $h_{FEG1}$ is the inverse current gain of the gate G1 and $I_{E8}$ is the emitter current of transistor Q8.

Once there is a further small increment in the input voltage applied to the base of Q3, current through transistor Q4 increases whilst the current through transistor Q3 decreases, hence the mirrored current decreases and the current flow begins into the base of transistor Q8. Once Q8 is conducting it diverts current from the path established via diode D2 and resistor 12 into $V_{ref}$ which lowers the voltage appearing at the input 6 of comparator 10 by reducing the voltage developed across the resistor R12. The change of state of the differential stage will be self sustaining if $$dV_{in-} <= dV_{b4}$$

where $V_{in-}$ is the voltage appearing at pad 2 and $V_{b4}$ is the voltage at the base of transistor Q4. In other words, the switch on of transistor Q4 is occurring by virtue of the change at the base of the transistor Q4 and not necessarily by the change in the input voltage.

To verify that this condition is true, it will be noted that $$dV_{b4} = dV_{in-} * h_{FE8} * R3$$

where GM is the transconductance of the differential stage, $h_{FE8}$ the dc current gain of the transistor Q8, and R3 is the value of resistor 12.

Hence for $dV_{in-} = 1$ $$dV_{b4} = GM \times h_{FE8} \times R3$$

which will be much greater than one. Thus, the necessary condition is fulfilled and the build up of current in Q8 is very fast since it is occurring by virtue of the gain of Q8 injecting current into the base of gate G2 which therefore turns on sending its outputs low. The output Q appearing at terminal 4 therefore goes low. As a current via Q8 grows, current via Q2 must diminish causing G1 to turn off. Since the mechanism of turning gate G2 on and gate G1 off is the same mechanism, output conflicts cannot occur. Transistor Q8 will quickly saturate causing transistor Q2 to be off, thus no current is supplied to the base of gate G1 which is also off. The output Q− of gate G1 appearing at terminal 5 is therefore high, and the flip-flop is reset. The cross coupling of the output of gate G2 to gate G1 has no effect since gate G2 cannot drive any current into base of G1. The coupling of G2 to G1 equally has no effect. The arrangement is therefore stable in this condition.

It will be noted that the flip-flop formed by gates G1 and G2 is maintained in its set condition until the regeneration of the differential stage has started, by virtue of the gate control via Q8 and Q2. Even if the input were to ramp down rapidly again before full regeneration, reset would not occur and spurious pulses would not be generated. The reset is controlled by transistor Q8 and transistor Q2 acting together to control gate G2 and G1 respectively. Since transistor Q8 and transistor Q2 form part of the same loop such glitch errors cannot occur. This contrasts with the performance of prior art integrated techniques involving separate output stages. These can trigger at a different point from the differential stage, that is before full regeneration of the differential stage. A sudden adverse change of input after output stage trigger would cause switch back immediately since it is not controlled as part of the input stage. Thus a glitch error occurs and any noise immunity normally provided by hysteresis of the input stage is ineffective. The gain provided by transistor Q8 ensures that reset is always hard driven by a regenerating loop and is not dependent on the rate of change of the input.

The state of the input of the differential input stage and the output stage described above is stable until the input voltage again approaches the reference voltage and this time a decrease in input voltage will be considered. As the voltage appearing at terminal 2 of comparator 10 decreases towards the reference voltage, transistor Q3 begins to switch on as the differential stage formed by transistor Q3 and transistor Q4 enters its active region; current through transistor Q4 is thereby reduced. As the current through transistor Q7 reduces, Q8 can no longer sustain saturation and the voltage at its collector begins to rise. Once diode D2 becomes forward biased, conduction occurs via diode D1 and resistor 12 into $V_{ref}$ and the decay of current via Q4 becomes regenerative due to the gain of transistor Q8 acting to increase the voltage at the base of transistor Q4 more quickly than the input voltage can change. However, before regeneration of the differential stage, the state of the flip-flop formed by gates G1 and G2 cannot change since, although transistor Q8 is coming out of saturation it can still accept the full current generated by current generator I2, so that there is still no drive to the base of gate G1. This is because:

$$(I_2 - d_{ID2}) \times h_{FEG2} > IR2$$

where $I_2$ is the current of current source I2, $d_{ID2}$ is the instantaneous current through diode D2, and $H_{FEG2}$ is the inverse current gain of the gate G2.

Only once the current flowing through transistor Q4 has reduced to the point where transistor Q7 becomes saturated, that is regeneration of the differential stage has commenced, is transistor Q8 pulled hard off and drive to the base of gate G2 ceases. The output Q of the gate G2 appearing at terminal 4 therefor goes high as the gate is turned off. By the same mechanism, transistor Q2 is now conducting and drives gate G1 on and therefore the output Q− appearing at terminal 5 goes low; the flip-flop is thereby reset. Again output overlap cannot occur.

The arrangement is now in a stable state as herein before described.

It will be appreciated that the upper threshold is given by:

$$V_{inh} = V_{ref} + I_2 \times R3$$

where R3 is the value of resistor 12, and the lower threshold is given by:

$$V_{inl} = V_{ref}$$

Hence the hysteresis is given by:

$$|H| = (I_2 \times R3)$$

Thus hysteresis may be programmed by control of the current source I2 and the resistor 12. The hysteresis will remain fixed in the event of supply voltage variations, provided the current generated by current generator I2 is constant.

Figure 2:
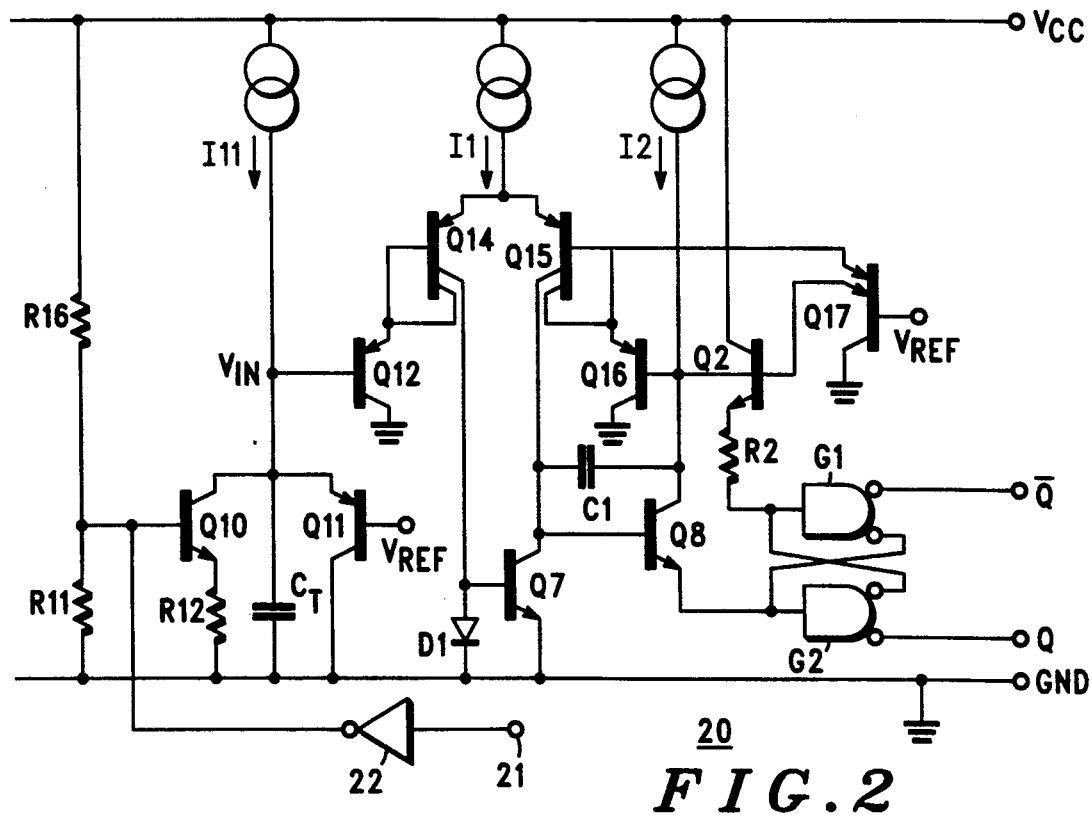
FIG. 2 represents an alternative embodiment of the present invention.

Further to promote full appreciation of the present invention, a second embodiment will now be described as part of a timing circuit 20 (FIG. 2). Where components of the circuit of FIG. 2 are functionally equivalent to those of FIG. 1, common references numerals have been used.

In response to a high signal applied at trigger input 21, transistor Q10 is turned off via inverting buffer stage 22. The current generated by current generator I11 is thereby diverted from Q10 to charge a timing capacitor $C_T$ to provide a positive going voltage at $V_{in}$, applied to one input of a differential stage constituted by the darlington pairs Q12, Q14 (on with $V_{in}$ low), and Q15, Q16 (off). Since during ramping D1 conducts, Q7 is held saturated and Q8 is off and the flip-flop constituted by injector-less I²L gates G1 and G2 is in the reset condition. As the ramp proceeds, eventually $V_{in}$ approaches the voltage applied to the base of Q16 which begins to conduct as the differential stage enters its active region. Regeneration of the differential stage by the gain of Q8 acting on the base voltage of Q16 occurs with the flip-flop held reset until full regeneration as described herein before in relation to the embodiment of FIG. 1; that is until Q8 can drive gate G2 on to set the flip-flop. The upper threshold of the comparator, that is the voltage to which $V_{in}$ must rise before Q changes, is given by:-

$$V_{in} = V_{ref}$$

It will be appreciated that a timing delay between the trigger input applied to input 21 and the setting of the flip-flop dependent only upon the rate of change of timing capacitor $C_T$ (that is by current provided by I11) has been provided. Over charging of $C_T$ is prevented by transistor Q11 coming on to direct the charging current flow when $V_{ref}$ plus the forward base-emitter voltage of Q11 is reached.

If $V_{in}$ were now made to fall (by means not shown in FIG. 2), eventually the differential stage would trigger the output stage as herein before described. It will be realised, however, that the voltage at which the stage begins to enter its active region, that is the lower threshold, is given by:-

$$V_{il} = V_{beG2} + V_{satQ8}$$

i.e. the base-emitter voltage of gate 2 plus the saturation voltage of Q8. Thus by virtue of multi-emitter transistor Q17 two different pairs are used as the reference side Darlington group (Q15–Q16, Q17–Q15) providing a difference in threshold value and thus effective hysteresis.

It will be appreciated that the performance of the above embodiments may be improved by techniques normally associated with differential amplifier comparators, such as the use of darlington configurations in place of single transistors, and improved accuracy and offset current sources, such as Wilson sources. For example, the embodiment of FIG. 2 includes a capacitor C1 to provide increased noise immunity by its integrating properties, although slightly adversely affecting regenerative current steering.

What I claim is:
1. A comparator circuit, comprising:
   a differential input stage including first and second inputs coupled for receiving a differential input signal and having first and second outputs for providing first and second differentially related signals;
   a differential to single-ended converter having first and second terminals coupled for receiving said first and second differentially related signals from said differential input stage respectively while providing a single-ended output signal at an output;
   a first transistor having a base, an emitter and a collector, said base being coupled to said output of said differential to single-ended converter;
   first current supply means having an output coupled to said collector of said first transistor for providing a first current of predetermined magnitude;
   a first diode having an anode coupled to said collector of said first transistor and having a cathode coupled to said second input of said differential input stage;
   a second transistor having a base, an emitter and a collector, said base being coupled to said output of said first current supply means, said collector being coupled to a first power supply conductor; and
   a flip-flop circuit having first and second inputs and an output, said first input being coupled to said emitter of said first transistor, said second input being coupled to said emitter of said second transistor, said output providing an output signal of the comparator circuit.

2. The comparator circuit of claim 1 wherein said differential input stage includes:
   second current supply means having an output for providing a second current of predetermined magnitude; and
   third and fourth transistors each having a base, an emitter and a collector, said bases being coupled for receiving said differential input signal, said emitters being coupled together to said output of said second current supply means, said collectors providing said first and second differentially related signals.

3. The comparator circuit of claim 2 wherein said differential to single-ended converter includes:
   a second diode having an anode coupled to said collector of said third transistor and having a cathode coupled to a second power supply conductor; and
   a fifth transistor having a base, an emitter and a collector, said base being coupled to said anode of said second diode, said emitter being coupled to said second power supply conductor, said collector being coupled to said collector of said fourth transistor at said output of said differential to single-ended converter.

4. A comparator circuit, comprising:
   first and second inputs;
   a differential input stage comprising,
      a first transistor having a base terminal coupled to said first input, a second transistor having a base terminal coupled to said second input and having a further terminal providing an output, said first and second transistors being coupled to a current mirror configuration whereby said output of said differential input stage is indicative of the relative voltage levels at said first and second inputs;
   an intermediate stage comprising,
      (a) a third transistor having a base terminal coupled to said output of said differential input stage and a further terminal coupled to said base terminal of said second transistor to cause regeneration in said differential input stage during a cross-over in relative voltage levels at said first and second inputs, and
      (b) means for inhibiting an output change until onset of regeneration of said differential stage; and
   an output stage comprising flip-flop means providing an output stage output, said flip-flop means being coupled to said intermediate stage to provide said output change on said output stage output as a result of said cross-over.

5. A comparator as claimed in claim 4 wherein said intermediate stage takes a first state before regeneration and a second state following onset of regeneration, said second state controlling said output stage.

6. A comparator as claimed in claim 5 wherein a state of said first and second states is a transistor off state and a state of said first and second states is a transistor saturated state.

7. A comparator as claimed in claim 4 and wherein hysteresis is provided by an offset applied to a reference voltage as an input to said differential stage in one state of said differential stage.

8. A comparator comprising:
first and second inputs;
a differential input stage comprising,
 a first transistor having a base terminal coupled to said first input, a second transistor having a base terminal coupled to said second input and having a further terminal providing an output, said first and second transistors being coupled to a current mirror configuration whereby said output of said differential input stage is indicative of the relative voltage levels at said first and second inputs;

an intermediate stage comprising,
 (a) current source means and a third transistor having a base terminal coupled to said output of said differential input stage and a further terminal coupled to said base terminal of said second transistor and to said current source means to control supply of current from the current source means to the second transistor, said control of current being responsive to the second transistor thereby providing regeneration in said differential input stage during a cross-over in relative voltage levels at said first and second inputs, and
 (b) a fourth transistor in said intermediate stage responsive to the supply of current to the second transistor for inhibiting an output change until onset of regeneration of said differential stage; and
an output stage comprising flip-flop means providing an output stage output, said flip-flop means being coupled to said intermediate stage to provide said output change on said output stage output as a result of said cross-over.

* * * * *